United States Patent [19]

Chiou et al.

[11] Patent Number: 5,286,660

[45] Date of Patent: Feb. 15, 1994

[54] METHOD FOR DOPING A SEMICONDUCTOR WAFER HAVING A DIFFUSIVITY ENHANCEMENT REGION

[75] Inventors: Herng-Der Chiou, Tempe; Gary G. Ehlenberger; Earl D. Fuchs, both of Phoenix, all of Ariz.

[73] Assignee: Motorola, Inc., Schaumburg, Ill.

[21] Appl. No.: 996,747

[22] Filed: Dec. 24, 1992

[51] Int. Cl.$^5$ ............................................ H01L 21/265
[52] U.S. Cl. ........................................ 437/24; 437/70; 437/141; 437/904
[58] Field of Search ................... 437/70, 10, 11, 12, 437/141, 904–906, 918, 928, 16, 24; 148/24, 138, 174

[56] References Cited

U.S. PATENT DOCUMENTS 3,796,929  3/1974  Nicholas et al. ................ 437/11
4,216,030  8/1980  Graul et al. ..................... 437/11

Primary Examiner—Robert Kunemund
Assistant Examiner—H. Jey Tsai
Attorney, Agent, or Firm—Joe E. Barbee; Rennie William Dover

[57] ABSTRACT

A diffusivity and a solubility of dopant atoms are increased within a semiconductor wafer (30). A portion (36) of the semiconductor wafer (30) is disrupted by a technique of ion implantation thereby forming a defect layer (36). A predeposition layer (37) is formed by placing the semiconductor wafer (30) in a predeposition furnace. The defect layer (36) has a large number of point defects in a semiconductor crystal lattice which accept dopant atoms in excess of their solid solubility limit. The point defects increase the diffusivity and solubility of the dopant atoms thereby increasing a junction depth and surface concentration in subsequent high temperature diffusion steps.

17 Claims, 3 Drawing Sheets

METHOD FOR DOPING A SEMICONDUCTOR WAFER HAVING A DIFFUSIVITY ENHANCEMENT REGION

BACKGROUND OF THE INVENTION

This invention relates, in general, to processing semiconductor wafers, and more particularly, to methods for doping semiconductor wafers.

Impurity materials are introduced into semiconductor wafers for a variety of reasons, including metallurgical junction formation, tailoring of active device characteristics such as current gains and breakdown voltages, and setting capacitance and resistance values. A common term applied to introducing impurity materials into semiconductor wafers is doping the semiconductor wafers. The two predominant techniques for doping a semiconductor wafer are diffusion and ion implantation. Diffusion is typically a two-step process comprising a first, or predeposition, step followed by a second or drive-in step. In the predeposition step, a semiconductor dopant is deposited on a surface of the semiconductor wafer, wherein some of the dopant diffuses into the semiconductor wafer. Since the surface dopant concentration remains substantially constant as the dopant diffuses into the semiconductor wafer, the predeposition step is referred to as a constant-source diffusion. A constant-source diffusion results in a dopant profile having a complementary error function distribution.

In the drive-in or redistribution step, the predeposited dopant is further diffused into the semiconductor wafer. During the drive-in step, the surface dopant concentration decreases as the dopant diffuses into the semiconductor wafer. Thus, the drive-in step is referred to as a limited-source diffusion. A limited-source diffusion results in a dopant profile following a Gaussian distribution. Although the two-step diffusion process is a useful doping technique, it is limited by the solid solubility limit of the dopant in the semiconductor wafer.

A second method for doping a semiconductor wafer is ion implantation. In the ion implantation method, a dopant ion is accelerated towards the semiconductor wafer and penetrates the semiconductor wafer upon impact. The depth of penetration is governed by the energy imparted to the ion during acceleration as well as the size of the ion. The depth of penetration is described by a projected range $R_p$ and a standard deviation of the projected range, $\Delta R_p$. The distribution of the dopant is nearly Gaussian in shape with a maximum dopant concentration at $R_p$. Limitations of this technique include a high cost for performing high dose implants.

Accordingly, it would be advantageous to have a method for doping a semiconductor wafer in excess of the solid solubility limit of dopants in a semiconductor wafer thereby providing a high surface dopant concentration. Further, it is desirable that the method optimize manufacturing costs while employing standard doping techniques.

SUMMARY OF THE INVENTION

Briefly stated, the present invention is a method for doping a semiconductor wafer. A semiconductor wafer having a major surface is provided. A portion of the semiconductor wafer is disrupted thereby forming a defect layer wherein the defect layer extends from the major surface into the semiconductor wafer. Formation of the defect layer provides additional vacancies and interstitials in a semiconductor crystal lattice structure thereby increasing the diffusivity and solubility of a dopant into a semiconductor substrate. Subsequently, a dopant is predeposited on the major surface in a predeposition step followed by a drive-in step.

DETAILED DESCRIPTION OF THE DRAWINGS

An integral step in the fabrication of semiconductor devices is the introduction of dopants or impurity materials into semiconductor substrates. This step is commonly referred to as doping a semiconductor substrate. In the present invention a new method for doping a semiconductor substrate is disclosed wherein the new method results in an increased solubility of dopants into the semiconductor substrate as well as an increased diffusivity of dopants within a portion of the semiconductor substrate.

Figure 1:
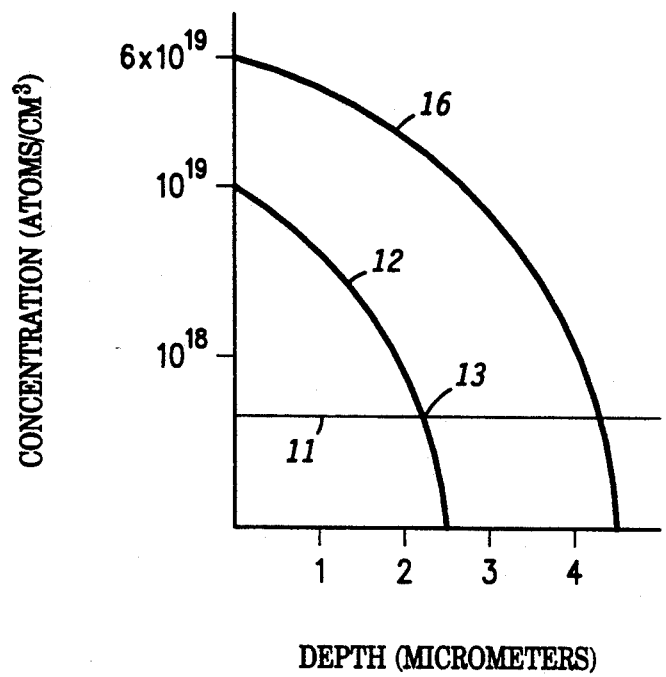
FIG. 1 illustrates comparative dopant profile curves in accordance with the present invention.

FIG. 1 illustrates a representative set of curves demonstrating the improvement obtained in doping a semiconductor substrate, such as a wafer, in accordance with the present invention. Each curve is a plot of the dopant concentration versus depth into a semiconductor substrate after a drive-in step. Curve 11 represents a dopant background concentration in a semiconductor substrate wherein the dopant is of a first impurity type. Curve 12 represents a dopant profile for a conventional doping process having a predeposition step followed by a drive-in step. Curve 12 follows a complementary error function distribution during the predeposition step becoming a Gaussian distribution during the drive-in step. A P-N junction is formed when the net impurity concentration is zero and is represented by the intersection of curves 11 and 12, denoted by reference numeral 13.

Curve 16 represents a dopant profile for a doping process in accordance with the present invention. A P-N junction is represented by the intersection of curves 11 and 16. The times and temperatures for the predeposition and drive-in steps for both the conventional doping process and the doping process of the present invention are the same. The concentration at zero depth into a semiconductor substrate is defined as the surface concentration and is significantly higher for the doping process in accordance with the present invention than for a conventional doping process. Further, the P-N junction is much deeper for the new and novel doping process.

The present invention is a method for doping a semiconductor substrate that takes advantage of the crystal defects generated by ion implantation and the controllability of dopant predeposition in a conventional diffusion process to modify the dopant profile. A layer of crystal defects extending from the surface is intentionally formed in the lattice structure of a semiconductor wafer, wherein the crystal defects increase the solubility of impurity or dopant atoms in the semiconductor wafer. The increased solubility provides an increased surface concentration of dopant atoms. Thus, the method modulates the solubility of a semiconductor dopant in a semiconductor wafer. Further, since the defect layer extends into the semiconductor substrate, a subsequent diffusion step effectively begins at the edge of the defect layer thereby providing a means for forming a deeper junction depth. This feature may be used to simultaneously form multiple junction depths without using multiple ion implant steps.

Figure 2:
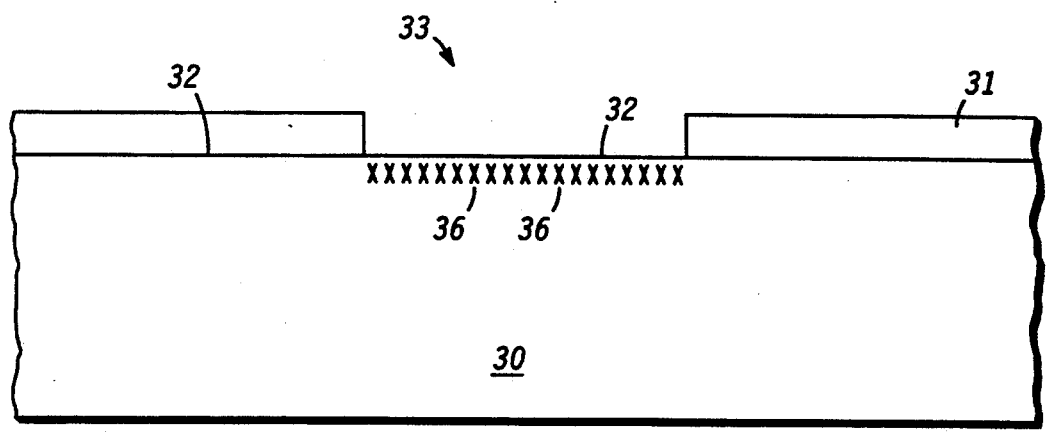
FIG. 2 is a highly enlarged cross-sectional view of a semiconductor wafer having a defect layer in accordance with the present invention.
Figure 3:
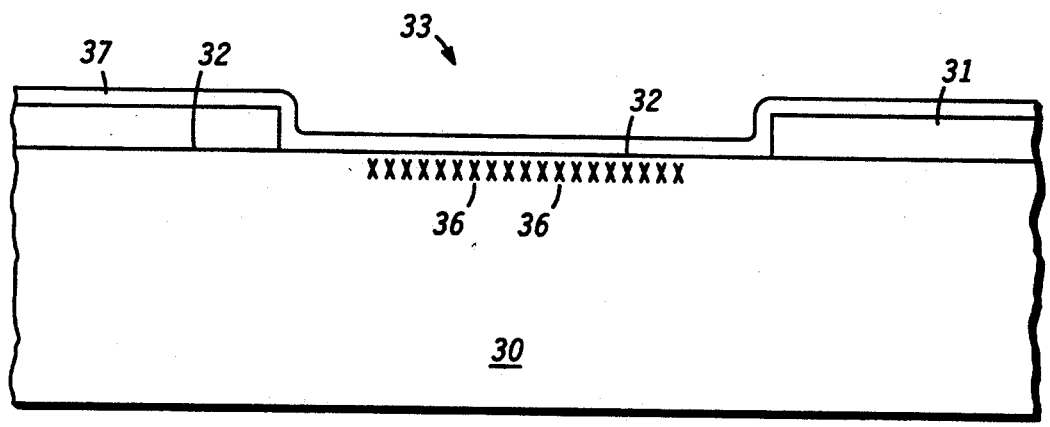
FIG. 3 is a highly enlarged cross-sectional view of the semiconductor wafer of FIG. 2 after a predeposition step in accordance with the present invention.
Figure 4:
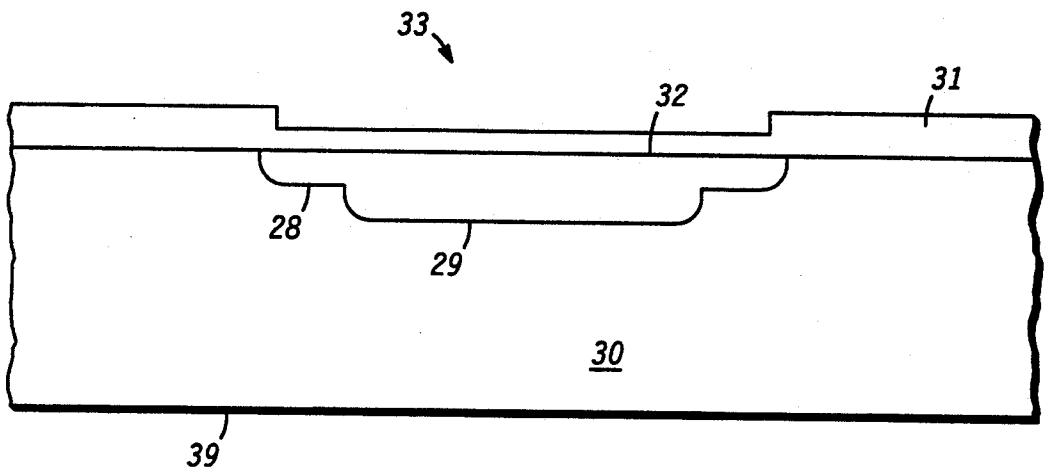
FIG. 4 is a highly enlarged cross-sectional view of the semiconductor wafer of FIG. 3 after a drive-in step in accordance with the present invention.

FIGS. 2-4 illustrate an embodiment in accordance with the present invention in which a zener diode is fabricated. FIG. 2 illustrates a highly enlarged cross-sectional view of a semiconductor wafer 30 having a defect layer 36 in accordance with the present invention. Semiconductor wafer 30 has a monocrystalline or single crystal lattice structure and a patterned dielectric layer 31 disposed thereon. In the zener diode embodiment, semiconductor wafer 30 is a phosphorus doped silicon semiconductor substrate having a resistivity of approximately 42 milliohm-centimeters. However, it shall be understood that semiconductor wafer 30 may be comprised of other semiconductor substrate materials such as, for example, germanium, gallium arsenide, silicon germanium, indium phosphide, or the like. It shall be further understood that the silicon semiconductor substrate of semiconductor wafer 30 may be either N or P conductivity type having a resistivity in the range of, approximately, 0.001 ohm-centimeter to 100 ohm-centimeters.

A layer of dielectric material 31 is formed over a major surface 32 of semiconductor wafer 30. Dielectric material 31 is patterned to form a window 33 exposing a portion of major surface 32. Dielectric layer 31 may be silicon dioxide, silicon nitride, polyimide, or any suitable dielectric material capable of serving as a masking layer. In the zener diode embodiment dielectric layer 31 is silicon dioxide. Dielectric layer 31 may have a thickness ranging between approximately 0.2 micrometers and 2 micrometers. Methods for forming and patterning a dielectric layer on a semiconductor substrate are well known in the art.

The monocrystalline lattice structure under the exposed portion of semiconductor wafer 30 is disrupted or altered, thereby forming a defect layer 36. Defect layer 36 is indicated in FIG. 2 by a string of x's. Defect layer 36 may comprise a layer of point defects or an amorphous layer. A convenient method for forming defect layer 36 is by placing semiconductor wafer 30 having patterned dielectric layer 31 in an ion implant apparatus (not shown) and implanting ions into semiconductor wafer 30. Ion implantation techniques and their disruptive effects on semiconductor substrate crystal lattice structures are well known in the semiconductor processing art.

Ions implanted into a semiconductor substrate disrupt a crystal lattice structure of that substrate, thereby increasing the number of point defects within the silicon crystal lattice. As is commonly known, increasing the number of point defects within a semiconductor crystal lattice structure increases the ease with which a dopant atom travels through the disrupted crystal lattice structure. Thus, the increase in the number of point defects results in an increase in the diffusivity of a dopant in a disrupted region of a semiconductor substrate such as defect layer 36. In addition, an increased number of point defects provides more locations for the dopant to occupy, effectively increasing the solubility of the dopant at a particular temperature.

The point defect concentration is determined by the size of the implanted ion and the dose at which the ion is implanted. A low implant dose of an ion of a particular size creates a layer of point defects wherein increasing the implant dose of that same ion increases the number of point defects. For a sufficiently high implant dose, an amorphous layer is formed which also results in an increase in the diffusivity and solubility of the dopant. Further, larger ions generate a higher density of point defects thereby requiring a lower implant dose to create defect layer 36 than for smaller ions. A depth or width of defect layer 36 is regulated by the energy used for the ion implant step.

In the zener diode embodiment, argon ions are implanted through window 33 into semiconductor wafer 30 to create defect layer 36, wherein defect layer 36 may be an amorphous layer. In this embodiment, the argon ions are implanted at a dose of approximately $5 \times 10^{15}$ ions/cm$^2$, an energy of approximately 120 kilo-electron volts. It shall be understood that the dose for the argon ion implant is not a limitation of the present invention. A dose for the argon ion implant may range from approximately $1 \times 10^{15}$ ions per cm$^2$ to $1 \times 10^{16}$ ions/cm$^2$. Since the depth, or width, of defect layer 36 is regulated by the implant energy, the argon ions may be implanted at an implant energy of 40 kilo-electron volts and still produce an amorphous defect layer 36. However, amorphous defect layer 36 will have a shallower depth for a 40 kilo-electron volt implant than for the 120 kilo-electron volt implant. Other suitable implant materials include boron ions, silicon ions, phosphorous ions, arsenic ions, complex ions such as boron difluoride, and the like.

After formation of defect layer 36, silicon dioxide layer 31 is patterned to form a guard ring structure for the zener diode. The silicon dioxide pattern is formed by extending a width of window 33 as shown in FIG. 3. Methods for forming a pattern in silicon dioxide layers such as layer 31 are well known in the art. The extension of window 33 exposes a portion of major surface 32 adjacent defect layer 36.

Still referring to FIG. 3, a predeposition layer 37 is formed by depositing dopant atoms over patterned silicon dioxide layer 31 the exposed portion of major surface 32 adjacent defect layer 36, and the exposed portion of major surface 32 which is over defect layer 36. In the zener diode embodiment, predeposition layer 37 is formed from a gaseous dopant source comprising boron trichloride (BCl$_3$). The predeposition step may be performed at a temperature ranging between approximately 750° C. and 1,000° C. It shall be understood that the type of predeposition source is not a limitation of the present invention. In other words, the predeposition layer may be deposited using a liquid dopant source or a solid dopant source. Methods for performing the predeposition step are well known in the art.

As previously discussed, the increased number of point defects generated by the ion implant step increases the concentration of the dopant or impurity atoms in semiconductor wafer 30 to a level greater than the solid solubility limit. For example, in the zener diode embodiment the concentration of boron atoms in defect layer 36 is approximately $2 \times 10^{21}$ atoms/cm$^2$, whereas the maximum solid solubility limit of boron into a non-disrupted semiconductor wafer at the same temperature is approximately $5 \times 10^{20}$ atoms/cm$^2$. Thus, the solubility of boron is increased in this region. Moreover, the increase in the solubility and the diffusion rate is not limited to boron, rather a defect layer increases the solubility of other silicon semiconductor dopants such as arsenic, phosphorus, or the like which occurs by creating defect layer 36. It shall be understood that the increase in the solubility and the diffusion rate are not limited to silicon semiconductor wafers but may occur with semiconductor substrates such as, for example, germanium, gallium arsenide, silicon germanium, and indium phosphide.

In the two-step technique, the predeposition step is followed by a drive-in step. FIG. 4 illustrates a highly enlarged cross-sectional view of semiconductor wafer 30 after a drive-in or redistribution step in accordance with the present invention. One example of a drive-in step in accordance with the zener diode embodiment of the present invention includes inserting semiconductor wafer 30, having defect layer 36 and predeposition layer 37 into a diffusion furnace (not shown) set at approximately 750° C. In the zener diode embodiment, predeposition layer 37 is removed prior to the drive-in step. Techniques for removing predeposition layer 37 are well known in the art. Although predeposition layer 37 is removed in the zener diode embodiment, it shall be understood that removal of predeposition layer 37 is optional. Preferably, silicon dioxide layer 31 remains on the semiconductor wafer 30 during the drive-in step. Subsequently, the diffusion furnace is ramped to a temperature of approximately 1200° C. in approximately 60 minutes. An ambient atmosphere comprising oxygen and nitrogen is introduced into the diffusion furnace for approximately 55 minutes, then the ambient atmosphere is changed to one comprising hydrogen and oxygen for approximately 120 minutes.

An anneal is performed by changing the ambient atmosphere to one comprising dry oxygen for approximately 120 minutes. Thus, defect layer 36 is annealed or converted into a substantially crystalline structure. The diffusion furnace is ramped down to approximately 750° C. in approximately 115 minutes and semiconductor wafer 30 is removed. A drive-in step may increase a thickness of an oxide layer such as silicon dioxide layer 31 and oxidizes portions of the semiconductor substrate that may be exposed when using an oxidizing ambient as described. Thus, as shown in FIG. 4 oxide layer 31 extends across major surface 32. However, it shall be understood that the method of driving the dopant into semiconductor wafer 30 is not a limitation of the present invention. In other words, other drive-in methods using oxidizing ambient environments as well as drive-in methods using non-oxidizing ambient environments may be used such as, for example, TEOS in a nitrogen ambient.

Thus, the present invention allows the simultaneous formation of a guard ring junction 28 and an active junction 29 wherein guard ring junction 28 is at a shallower junction depth than active junction 29. Further, the formation of these two junctions only requires a medium dose of argon rather than two high dose ion implant steps thereby resulting in a monetary and time savings. A medium dose of argon ranges between approximately $1 \times 10^{15}$ ions/cm$^2$ and $5 \times 10^{15}$ ions/cm$^2$.

Although not shown, it shall be understood that completion of zener diode formation requires providing metal contacts. Typically, the silicon dioxide in window 33 is removed exposing a portion of major surface 32 and a layer of metal is deposited over the exposed portion of major surface 32. Subsequently, a thinning process is performed on a back-side 39 of semiconductor wafer 30 followed by deposition of a metal layer on back-side 39. Methods for forming metal contacts to a zener diode are well known in the art.

Figure 5:
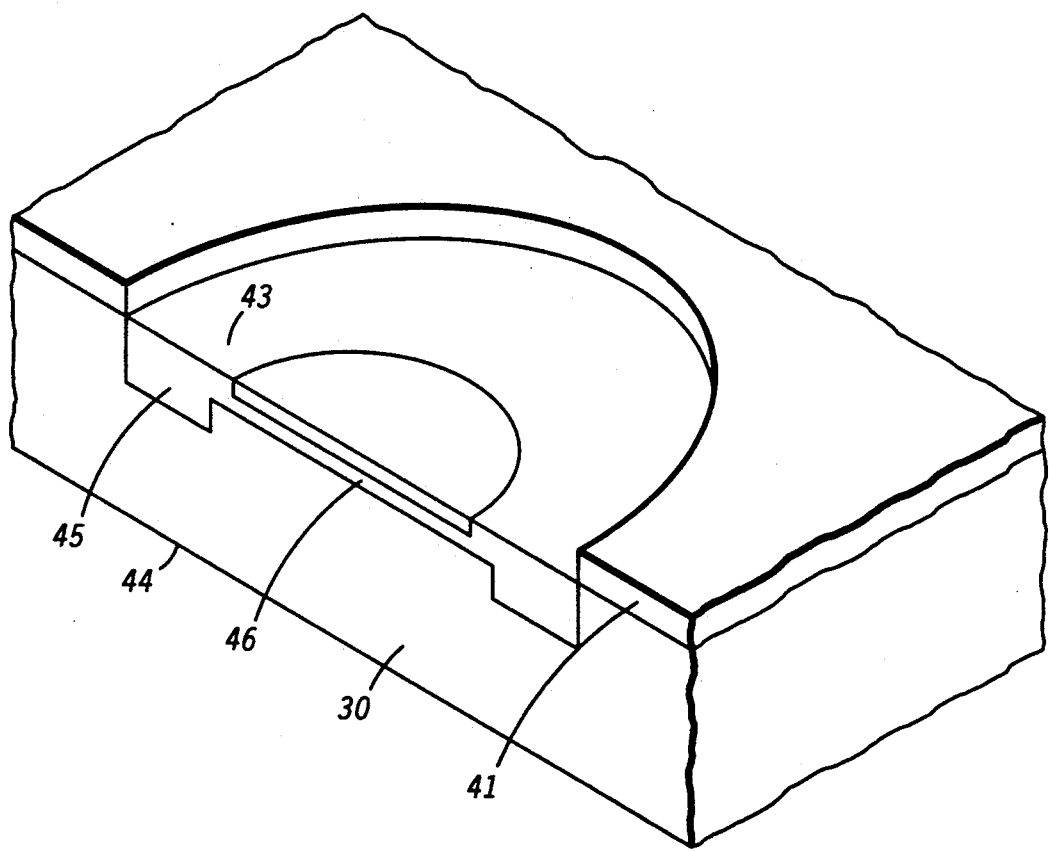
FIG. 5 is a highly enlarged cross-sectional perspective view of a portion of a transistor embodiment in accordance with the present invention.

Referring now to FIG. 5, a highly enlarged cross-sectional perspective view of a processing step of a portion of a radio-frequency transistor embodiment is shown. The processing steps are similar to those of the zener diode embodiment. However, the patterning of silicon dioxide layer 41 is modified to form an annular window through which an annular defect layer is formed. After formation of the annular defect layer, the silicon dioxide present within the annular window is removed thereby exposing a circular portion of semiconductor wafer 30. As in the zener diode embodiment, the two-step doping process is performed wherein the base region 45 is formed. An emitter region 46 is formed at the center of the circular portion. Base and emitter electrodes (not shown) are formed on surface 43 of semiconductor wafer 30 and a collector electrode (not shown) is formed on the back-side 44 of semiconductor wafer 30. Methods for forming emitter regions, and emitter, base, and collector electrodes are well known in the art.

Figure 6:
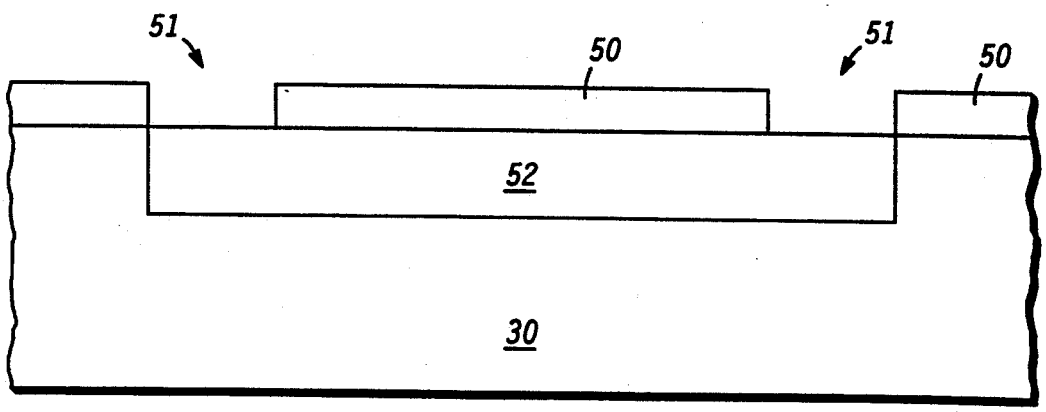
FIG. 6 is a highly enlarged cross-sectional view of a portion of a resistor embodiment in accordance with the present invention.

Now referring to FIG. 6, a highly enlarged cross-sectional view of a portion of a resistor embodiment is shown. Again, the processing steps are similar to those of the zener diode embodiment. However, the patterning of silicon dioxide layer 50 is modified to form a rectangular window in which a defect layer is formed. In the resistor embodiment shown in FIG. 6, a rectangular resistor is shown, however it shall be understood that resistors of other shapes may be formed. After formation of the defect layer the two-step doping process is performed forming a doped layer 52. The drive-in portion of the two-step doping process forms an oxide in rectangular window thereby forming a single silicon dioxide layer 50. Openings 51 are formed through silicon dioxide layer 50 and metal contacts (not shown) are made to semiconductor wafer 30 through the openings. Methods of forming metal contacts to resistors are well known in the art. The high doping permitted by the defect layer allows formation of resistors having low resistor values.

By now it should be appreciated that a method for increasing both the solubility of dopant atoms into a semiconductor substrate, and the diffusivity of the dopant atoms within a portion of the semiconductor substrate has been provided. In addition, the increased diffusivity and concentration gradient of dopant atoms into the semiconductor provides for an increased junction depth. The method takes advantage of damage caused by ion implantation to enhance the solubility and diffusivity a deposited dopant atoms. More particularly, the method increases the solubility of a dopant by creating point defects within the semiconductor lattice using ion implantation thereby creating vacancies within the lattice structure of the semiconductor substrate that may be filled by the dopant atoms. Thus, one feature of the present invention is that it provides a method for modulating the solubility of a semiconductor dopant in a semiconductor wafer.

A major difference in the doping profile occurs at the predeposition step wherein the predeposition dopant concentration is initially high and maintains a substantially flat profile in the defect layer rather than the complementary error function profile typical of a predeposition step. In semiconductor substrate below the defect layer the predeposition profile becomes a complementary error function profile. The dopant profile of the drive-in step becomes a Gaussian profile wherein the concentration of dopant atoms is higher than in a conventional method. Further, the present invention allows a method for achieving a high surface concentration and deeper junction depths without the use of more costly techniques such as multiple ion implants.

The present invention is useful in, but not limited to, guard ring formation, providing a lower base resistance and an increased emitter efficiency in bipolar junction transistors, and formation of heavily doped resistors. In addition, the present invention provides a method for simultaneously forming two P-N junctions wherein the two P-N junctions are at different junction depths.

We claim:

1. A method for doping a semiconductor wafer, comprising the steps of:
   providing a semiconductor wafer having a monocrystalline lattice structure and a major surface;
   disrupting a portion of the monocrystalline lattice structure, wherein the portion extends from the major surface into the semiconductor wafer;
   forming a dopant predeposition layer on the disrupted portion of the major surface and a portion of the major surface that is not disrupted; and
   performing a drive-in step wherein the dopant diffuses into the semiconductor wafer forming a first junction and a second junction simultaneously, the first junction at a shallower junction depth than the second junction.

2. A method for doping a semiconductor wafer as claimed in claim 1 wherein the step of disrupting a portion of the monocrystalline lattice structure includes implanting ions into the major surface.

3. A method for doping a semiconductor wafer as claimed in claim 2 wherein the step of implanting ions into the major surface includes implanting argon ions.

4. A method for doping a semiconductor wafer as claimed in claim 1 wherein the step of forming a dopant predeposition layer includes using a gaseous source.

5. A method for introducing a dopant into a semiconductor wafer, comprising the steps of:
   providing a semiconductor wafer having a single crystalline lattice structure and a major surface;
   forming a layer of dielectric material over the major surface, the layer of dielectric material patterned to expose a first portion of the major surface;
   implanting ions into the first portion of the major surface thereby disrupting the single crystalline lattice structure of the first portion;
   exposing a second portion of the major surface, the second portion of the major surface adjacent the first portion of the major surface;
   depositing a dopant on the first and second portions of the major surface; and
   diffusing the dopant into the semiconductor wafer through the first and second portions.

6. A method for introducing a dopant into a semiconductor wafer as claimed in claim 5 wherein the step of implanting ions into the major surface includes implanting argon ions.

7. A method for introducing a dopant into a semiconductor wafer as claimed in claim 6 wherein the step of implanting argon ions into the major surface includes implanting argon at a dose of approximately $5 \times 10^{15}$ ions/cm$^2$ and an implant energy of approximately 120 kilo-electron volts.

8. A method for introducing a dopant into a semiconductor wafer as claimed in claim 7 wherein the step of depositing a dopant on the major surface includes depositing a dopant comprising boron.

9. A method for introducing a dopant into a semiconductor wafer as claimed in claim 5 wherein the step of depositing the dopant into the semiconductor wafer includes depositing the dopant at a temperature between, approximately, 750° C. and 1000° C.

10. A method for modulating a solubility of a semiconductor dopant in a semiconductor wafer, comprising the steps of:
    providing a semiconductor wafer wherein the semiconductor wafer has a crystalline lattice structure;
    altering a portion of the crystalline lattice structure;
    providing a semiconductor dopant in the altered portion and in an adjacent unaltered portion of the crystalline lattice structure; and
    diffusing the semiconductor dopant into the semiconductor wafer.

11. A method for modulating a solubility of a semiconductor dopant in a semiconductor wafer as claimed in claim 10 wherein the step of altering a portion of the crystalline lattice structure includes converting the portion of the crystalline lattice structure into an amorphous layer.

12. A method for modulating a solubility of a semiconductor dopant in a semiconductor wafer as claimed in claim 10 wherein the step of altering a portion of the crystalline lattice structure includes implanting an ion in the portion of the crystalline lattice structure.

13. A method for modulating a solubility of a semiconductor dopant in a semiconductor wafer as claimed in claim 12 wherein the step of altering a portion of the crystalline lattice structure includes implanting argon.

14. A method for modulating a solubility of a semiconductor dopant in a semiconductor wafer as claimed in claim 10 wherein the step of providing a semiconductor dopant includes providing a dopant from a gaseous source.

15. A method for modulating a solubility of a semiconductor dopant in a semiconductor wafer as claimed in claim 10 wherein the step of providing a semiconductor dopant includes providing a dopant from a solid source.

16. A method of modulating a solubility of a semiconductor dopant in a semiconductor wafer as claimed in claim 10 wherein the step of diffusing the semiconductor includes forming at least two junctions, the at least two junctions at different junction depths.

17. A method for modulating a solubility of a semiconductor dopant in a semiconductor wafer as claimed in claim 10 wherein the step of providing a semiconductor wafer includes providing a semiconductor wafer wherein the semiconductor material is selected from the group consisting of silicon, gallium arsenide, germanium, silicon germanium, or indium phosphide.

* * * * *

UNITED STATES PATENT AND TRADEMARK OFFICE
CERTIFICATE OF CORRECTION

PATENT NO.  : 5,286,660
DATED       : February 15, 1994
INVENTOR(S) : Chiou et al.

It is certified that error appears in the above-indentified patent and that said Letters Patent is hereby corrected as shown below:

On title page: Item [54] and Column 1, line 3,

In the title, replace "DIFFUSIVITY" with --DIFFUSION--.

Signed and Sealed this

Twenty-first Day of February, 1995

Attest:

BRUCE LEHMAN

*Attesting Officer*     *Commissioner of Patents and Trademarks*